(12) United States Patent
Jeddeloh

(10) Patent No.: US 9,229,887 B2
(45) Date of Patent: Jan. 5, 2016

(54) MEMORY DEVICE WITH NETWORK ON CHIP METHODS, APPARATUS, AND SYSTEMS

(75) Inventor: Joe M. Jeddeloh, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 750 days.

(21) Appl. No.: 12/033,684

(22) Filed: Feb. 19, 2008

(65) Prior Publication Data
US 2009/0210600 A1    Aug. 20, 2009

(51) Int. Cl.
*G06F 12/00* (2006.01)
*G06F 13/16* (2006.01)

(52) U.S. Cl.
CPC .................................. *G06F 13/1657* (2013.01)

(58) Field of Classification Search
USPC .......................................... 257/777; 711/154
See application file for complete search history.

(56) References Cited

U.S. PATENT DOCUMENTS

| | | | |
|---|---|---|---|
| 4,727,516 A | 2/1988 | Yoshida et al. | |
| 4,937,790 A | 6/1990 | Sasaki et al. | |
| 5,195,057 A | 3/1993 | Kasa et al. | |
| 5,233,614 A | 8/1993 | Singh | |
| 5,347,428 A | 9/1994 | Carson et al. | |
| 5,432,729 A | 7/1995 | Carson et al. | |
| 5,807,791 A | 9/1998 | Bertin et al. | |
| 5,815,427 A | 9/1998 | Cloud et al. | |
| 5,914,953 A * | 6/1999 | Krause et al. | 370/392 |
| 5,943,692 A * | 8/1999 | Marberg et al. | 711/203 |
| 5,973,392 A | 10/1999 | Senba et al. | |
| 6,046,945 A | 4/2000 | Su et al. | |
| 6,047,002 A * | 4/2000 | Hartmann et al. | 370/466 |
| 6,081,463 A | 6/2000 | Shaffer et al. | |
| 6,154,851 A | 11/2000 | Sher et al. | |
| 6,201,733 B1 | 3/2001 | Hiraki et al. | |
| 6,438,029 B2 | 8/2002 | Hiraki et al. | |

(Continued)

FOREIGN PATENT DOCUMENTS

| CN | 102822966 A | 12/2012 |
|---|---|---|
| CN | 101946245 B | 1/2014 |

(Continued)

OTHER PUBLICATIONS

"Terrazon 3D Stacked Microcontroller with DRAM—FASTACK 3D Super-8051 Micro-controller", http://www.tezzaron.com/OtherICs/Super_8051.htm, (Link sent Oct. 2, 2007),2 pgs.

(Continued)

*Primary Examiner* — Jared Rutz
*Assistant Examiner* — Hamdy S Ahmed
(74) *Attorney, Agent, or Firm* — Schwegman Lundberg & Woessner, P.A.

(57) ABSTRACT

Apparatus, method and systems are provided such as those that can include a processor module, an interface device disposed above or below the processor module, the interface device including a plurality of routing elements, at least one memory device disposed above or below the interface device and including a plurality of memory arrays, the plurality of memory arrays coupled to the interface device using a plurality of interconnects provided in vias provided in at least one of the memory device and the interface device. In addition, the interface device communicatively can couple the plurality of memory arrays to the processor module using the plurality of routing elements and the interconnects.

26 Claims, 7 Drawing Sheets

(56) References Cited

U.S. PATENT DOCUMENTS

| | | | |
|---|---|---|---|
| 6,574,757 | B1 | 6/2003 | Park et al. |
| 6,582,992 | B2 | 6/2003 | Poo et al. |
| 6,661,712 | B2 | 12/2003 | Hiraki et al. |
| 6,754,117 | B2 | 6/2004 | Jeddeloh |
| 6,778,404 | B1 | 8/2004 | Bolken et al. |
| 6,791,832 | B2 | 9/2004 | Budny |
| 6,822,912 | B2 | 11/2004 | Shimizu et al. |
| 6,897,096 | B2 | 5/2005 | Cobbley et al. |
| 7,124,200 | B2 * | 10/2006 | Sato et al. ............. 709/239 |
| 7,200,021 | B2 | 4/2007 | Raghuram |
| 7,415,640 | B1 | 8/2008 | Zorian et al. |
| 7,599,205 | B2 | 10/2009 | Rajan |
| 7,623,365 | B2 * | 11/2009 | Jeddeloh ............. 365/63 |
| 7,734,966 | B1 | 6/2010 | Lee et al. |
| 7,855,931 | B2 | 12/2010 | Laberge et al. |
| 8,063,491 | B2 | 11/2011 | Hargan |
| 8,086,913 | B2 | 12/2011 | Houg |
| 8,120,958 | B2 | 2/2012 | Bilger et al. |
| 8,127,204 | B2 | 2/2012 | Hargan |
| 8,233,303 | B2 | 7/2012 | Best et al. |
| 8,281,074 | B2 | 10/2012 | Jeddeloh |
| 8,476,735 | B2 | 7/2013 | Hsu et al. |
| 2003/0197281 | A1 | 10/2003 | Farnworth et al. |
| 2004/0164412 | A1 | 8/2004 | Bolken et al. |
| 2004/0250046 | A1 | 12/2004 | Gonzalez et al. |
| 2004/0257847 | A1 | 12/2004 | Matsui et al. |
| 2006/0055020 | A1 | 3/2006 | Bolken et al. |
| 2006/0126369 | A1 | 6/2006 | Raghuram |
| 2007/0045780 | A1 * | 3/2007 | Akram et al. ............. 257/621 |
| 2007/0075734 | A1 | 4/2007 | Ramos et al. |
| 2007/0132085 | A1 | 6/2007 | Shibata et al. |
| 2007/0290315 | A1 | 12/2007 | Emma et al. |
| 2009/0059641 | A1 * | 3/2009 | Jeddeloh ............. 365/63 |
| 2009/0132876 | A1 | 5/2009 | Freking et al. |
| 2009/0210600 | A1 | 8/2009 | Jeddeloh |
| 2009/0319703 | A1 | 12/2009 | Chung |
| 2010/0005238 | A1 | 1/2010 | Jeddeloh et al. |
| 2010/0064186 | A1 | 3/2010 | Houg |
| 2010/0078829 | A1 | 4/2010 | Hargan |
| 2011/0090004 | A1 | 4/2011 | Schuetz |
| 2011/0148469 | A1 | 6/2011 | Ito et al. |
| 2011/0246746 | A1 | 10/2011 | Keeth et al. |
| 2012/0096307 | A1 | 4/2012 | Houg |

FOREIGN PATENT DOCUMENTS

| | | | |
|---|---|---|---|
| CN | 103761204 | A | 4/2014 |
| EP | 0606653 | | 7/1994 |
| EP | 0606653 | A1 | 7/1994 |
| JP | 61196565 | A | 8/1986 |
| JP | 6251172 | A | 9/1994 |
| JP | 11194954 | A | 7/1999 |
| JP | 2002259322 | A | 9/2002 |
| JP | 2004327474 | A | 11/2004 |
| JP | 2005004895 | A | 6/2005 |
| JP | 2005244143 | A | 9/2005 |
| JP | 2007129699 | A | 5/2007 |
| JP | 2007140948 | A | 6/2007 |
| TW | 358907 | | 5/1999 |
| TW | 201220374 | A | 5/2012 |
| WO | WO-2009105204 | | 8/2009 |
| WO | WO-2009105204 | A2 | 8/2009 |
| WO | WO-2009105204 | A3 | 8/2009 |
| WO | WO-2011126893 | A2 | 10/2011 |
| WO | WO-2011126893 | A3 | 10/2011 |

OTHER PUBLICATIONS

"Terrazon 3D Stacked DRAM Bi-STAR Overview", http://www.tezzaron.com/memory/Overview_3D_DRAM.htm, (Link sent Oct. 2, 2007),1 pg.

"Terrazon FaStack Memory—3 D Memory Devices", http://www.tezzaron.com/memory/Overview_3D_DRAM.htm, (Link sent Oct. 2, 2007 Downloaded Oct. 27, 2007),3 pgs.

Gann, Keith D., "Neo-stacking technology", *Irvine Sensors Corporation News Release*, (Mar. 2007),4 pgs.

"International Application Serial No. PCT/US2009/001017, Search Report and Written Opinion mailed Aug. 25, 2009", 12 pgs.

"European Application Serial No. 09712316.0, Office Action mailed Aug. 2, 2011", 5.

"Chinese Application Serial No. 200980105675.X, Office Action mailed Jun. 18, 2013", w/English Translation, 5 pgs.

"Chinese Application Serial No. 200980105675.X, Response filed Aug. 28, 2013 to Office Action mailed Jun. 18, 2013", w/English Claims, 11 pgs.

"European Application Serial No. 09712316.0, Response filed Aug. 22, 2013 to Office Action mailed Feb. 22, 2013", 10 pgs.

"European Application Serial No. 11766502.6, Extended European Search Report mailed Oct. 11, 2013", 5 pgs.

"European Application Serial No. 11766502.6, Office Action mailed Oct. 29, 2013", 1 pg.

"European Application Serial No. 11766502.6, Response filed May 7, 2014 to Office Action mailed Oct. 29, 2013", 10 pgs.

"Japanese Application Serial No. 2010-546799, Office Action mailed Mar. 11, 2014", w/English Translation, 6 pgs.

"Japanese Application Serial No. 2010-546799, Office Action mailed Jul. 30, 2013", w/English Translation, 11 pgs.

"Japanese Application Serial No. 2010-546799, Response filed May 22, 2014", w/English Claims, 12 pgs.

"Japanese Application Serial No. 2010-546799, Response filed Oct. 23, 2013 to Office Action mailed Jul. 30, 2013", w/English Claims, 14 pgs.

"Taiwan Application Serial No. 098104986, Re-exam Brief filed Sep. 27, 2013", w/English Claims, 27 pgs.

"U.S. Appl. No. 12/750,448 , Response filed Feb. 15, 2013 to Non Final Office Action mailed Oct. 15, 2012", 14 pgs.

"U.S. Appl. No. 12/750,448, Non Final Office Action mailed Oct. 15, 2012", 9 pgs.

"U.S. Appl. No. 13/332,553, Final Office Action mailed Feb. 25, 2013", 12 pgs.

"U.S. Appl. No. 13/332,553, Non Final Office Action mailed Oct. 22, 2012", 13 pgs.

"U.S. Appl. No. 13/332,553, Response filed Jan. 22, 2013 to Non Final Office Action mailed Oct. 22, 2012", 10 pgs.

"U.S. Appl. No. 13/332,553, Response filed Sep. 27, 2012 to Restriction Requirement mailed Aug. 27, 2012", 6 pgs.

"U.S. Appl. No. 13/332,553, Response filed Apr. 25, 2013 to Final Office Action mailed Feb. 25, 2013", 7 pgs.

"U.S. Appl. No. 13/332,553, Restriction Requirement mailed Aug. 27, 2012", 7 pgs.

"Chinese Application Serial No. 200980105675.X, Office Action mailed Aug. 27, 2012", 17 pgs.

"Chinese Application Serial No. 200980105675.X, Response filed Mar. 4, 2013 to Office Action mailed Aug. 27, 2012", 11 pgs.

"European Application Serial No. 09712316.0, Office Action mailed Feb. 22, 2013", 5 pgs.

"European Application Serial No. 09712316.0, Response filed Feb. 13, 2012 to Search Report mailed Aug. 2, 2011", 8 pgs.

"International Application Serial No. PCT/US2009/001017, International Preliminary Report on Patentability mailed Sep. 2, 2010", 7 pgs.

"International Application Serial No. PCT/US2011/030544, International Preliminary Report on Patentability mailed Oct. 11, 2012", 7 pgs.

"International Application Serial No. PCT/US2011/030544, Search Report mailed Dec. 7, 2011", 3 pgs.

"International Application Serial No. PCT/US2011/030544, Written Opinion mailed Dec. 7, 2011", 5 pgs.

"Taiwan Application Serial No. 098104986, Final Office Action mailed Mar. 28, 2013", w/English Claims, 8 pgs.

"Taiwan Application Serial No. 098104986, Office Action mailed Sep. 5, 2012", w/English Translation, 34 pgs.

"Taiwan Application Serial No. 098104986, Response filed Dec. 1, 2012 to Office Action mailed Sep. 5, 2012", w/English Translation, 12 pgs.

* cited by examiner

COMMAND PACKET

DATA PACKET

MEMORY DEVICE WITH NETWORK ON CHIP METHODS, APPARATUS, AND SYSTEMS

BACKGROUND

Many electronic devices, such as personal computers, workstations, computer servers, mainframes and other computer related equipment, including printers, scanners and hard disk drives, make use of memory devices that provide a large data storage capability, while attempting to incur low power consumption. One type of memory device that is well-suited for use in the foregoing devices is the dynamic random access memory (DRAM).

The demand for larger capacity of memory devices continue to rise and at the same time chip size limitations bound the capacity of these memory devices. The surface area occupied by the components of individual memory cells has been steadily decreased so that the packing density of the memory cells on a semiconductor substrate can be increased along with the gate delays being decreased. Shrinking of the device surface area can result in reducing manufacturing yield, as well as increasing the complexity of interconnects used to connect the numerous banks within the DRAM devices with other devices. Additionally, during miniaturization, interconnect delays do not scale as well as gate delays.

BRIEF DESCRIPTION OF THE DRAWINGS

Various embodiments of the present invention are described in detail below with reference to the following drawings.

DETAILED DESCRIPTION

Surface area reduction and a consequent increase in the packing density of memories can be achieved by decreasing the horizontal feature size of memory arrays. This can be achieved in various embodiments by forming memory arrays that are significantly three-dimensional, so that the memory arrays extend vertically into and above the substrate, in addition to generally extending across the surface of the substrate.

Figure 1:
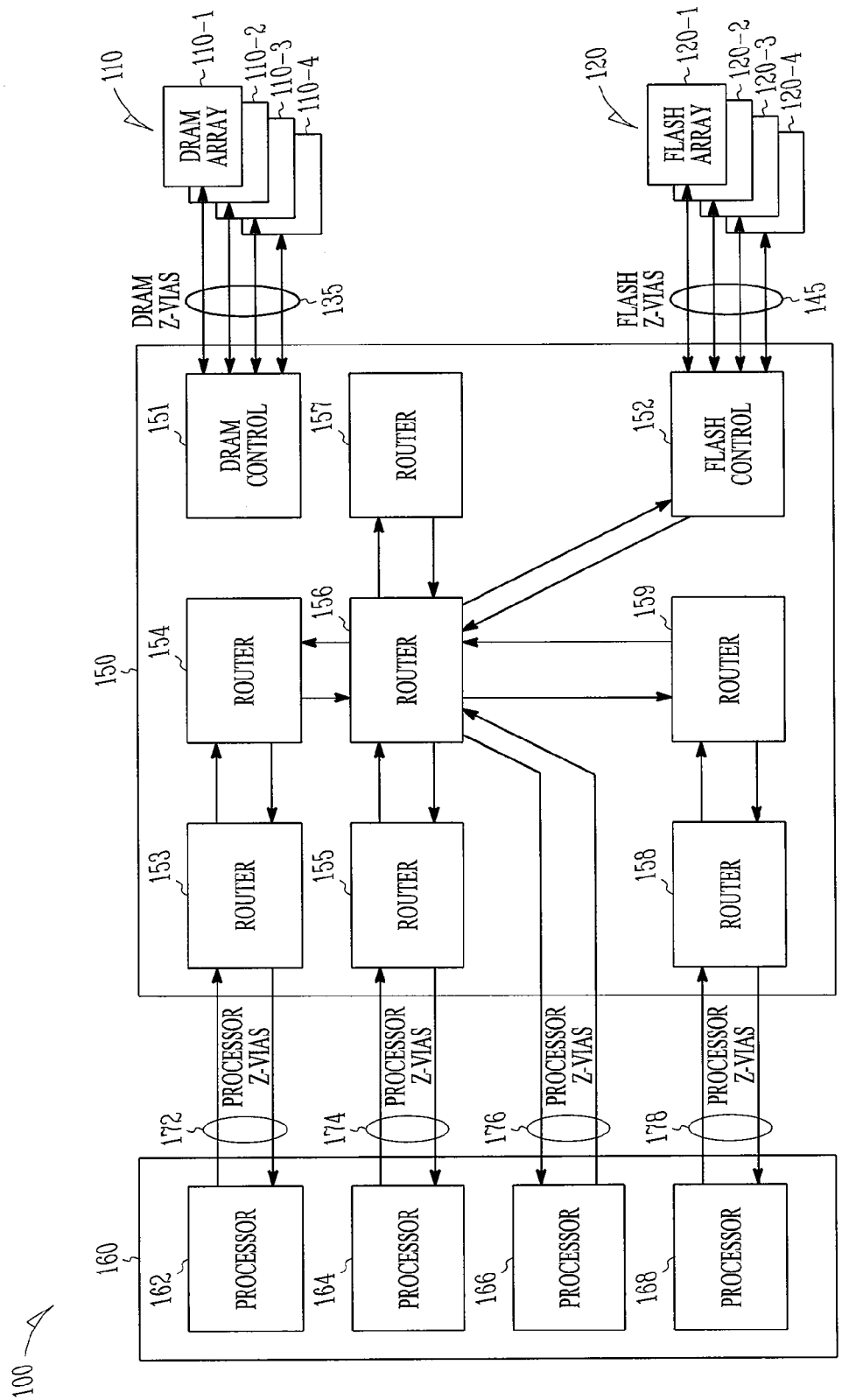
FIG. 1 illustrates a block diagram of a memory system, according to various embodiments of the invention.

FIG. 1 illustrates a block diagram of memory system 100 according to various embodiments of the invention. The memory system 100 includes an interface device 150 coupled to memory devices 110, 120 and processor module 160. In some embodiments, interface device 150 includes routing elements 153, 154, 155, 156, 157, 158 and 159 that are interconnected with each other. In some embodiments, interface device 150 also includes a DRAM controller 151 and a Flash controller 152. In some embodiments, DRAM controller 151 includes a non page mode controller. In some embodiments, DRAM controller 151 includes an out of order command queue provided with memory command bus optimization. In some embodiments, the DRAM controller 151 can be programmable and contain Built-in Self Test (BIST) to aid memory testing.

Interface device 150 is coupled to memory devices 110, 120 using interconnections provided through memory Z-vias 135 and 145, respectively. Memory Z-vias are openings provided within the memory device (110, 120) that allows for vertical interconnects to partially or completely pass through the memory device (110, 120) allowing connectivity between memory arrays situated above and below a particular memory array located within the memory device. In some embodiments, interconnects within memory Z-vias 135, 145 include 128-bit data busses. In some embodiments, processing module 160 includes processors 162, 164, 166 and 168 that are coupled to routing elements 153, 155, 156 and 158 using processor Z-vias 172, 174, 176 and 178, respectively. In some embodiments, processing module 160 includes a general-purpose processor or an application specific integrated circuit (ASIC). In some embodiments, processing module 160 can comprise a single-core processor and/or a multiple-core processor.

In some embodiments, memory device 110 includes memory arrays 110-1, 110-2, 110-3 and 110-4, each memory array having memory cells logically arranged in rows and columns. Similarly, in some embodiments, memory device 120 includes memory arrays 120-1, 120-2, 120-3 and 120-4, each memory array having memory cells logically arranged in rows and columns. The interface device 150 provides memory commands to selected memory addresses within the memory devices 110 and 120. In some embodiments, memory devices 110, 120 include Dynamic Random Access Memory (DRAM) devices. In some embodiments, the interface device 150 includes circuitry configured to perform DRAM sequencing.

In some embodiments, interface device 150 is configured to implement a refresh scheme to control error rates based on the type of DRAM used in memory device 110 and 120. An activation pulse for reading and rewriting and a precharge pulse indicating the original state are supplied from a command decoder during an auto refresh sequence acting on a memory address, and a clock signal is applied to the DRAM. In order to avoid a loss of data, the memory cells of DRAMs (dynamic random access memories) have to be regularly read and then have their contents rewritten, which is referred to as a "refresh" of the memory cells. In some embodiments, the interface device 150 is configured to operate a refresh scheme to control error rates based on the particular signal characteristics of each of memory devices 110 and 120.

In some embodiments, interface device 150 is configured to operate a bad cell recovery scheme on the plurality of memory arrays included within memory devices 110 and 120. In some embodiments, the interface device 150 is programmable and configured to operate based on the type of the memory die disposed adjacent to it. In some embodiments, the interface device 150 is configured to operate a bad cell recovery scheme on the plurality of memory arrays 110-1, 110-2, 110-3 and 110-4. In some embodiments, the interface device 150 includes a pattern generator configured to generate test pattern signals that are used for testing and diagnostic analysis of memory devices 110 and 120.

In some embodiments, interface device 150 acts as an interconnection device and an I/O driver. In some embodiments, the interface device 150 includes traditional functional blocks present within DRAM dice, such as I/O pads, delayed-locked loop (DLL) circuitry, and First In, First Out (FIFO) circuitry that provides read and write pointers, storage, and control logic. Transferring these functional blocks, from the DRAM dice into the interface device 150 allows for the increase in storage area of the DRAM.

Figure 3:
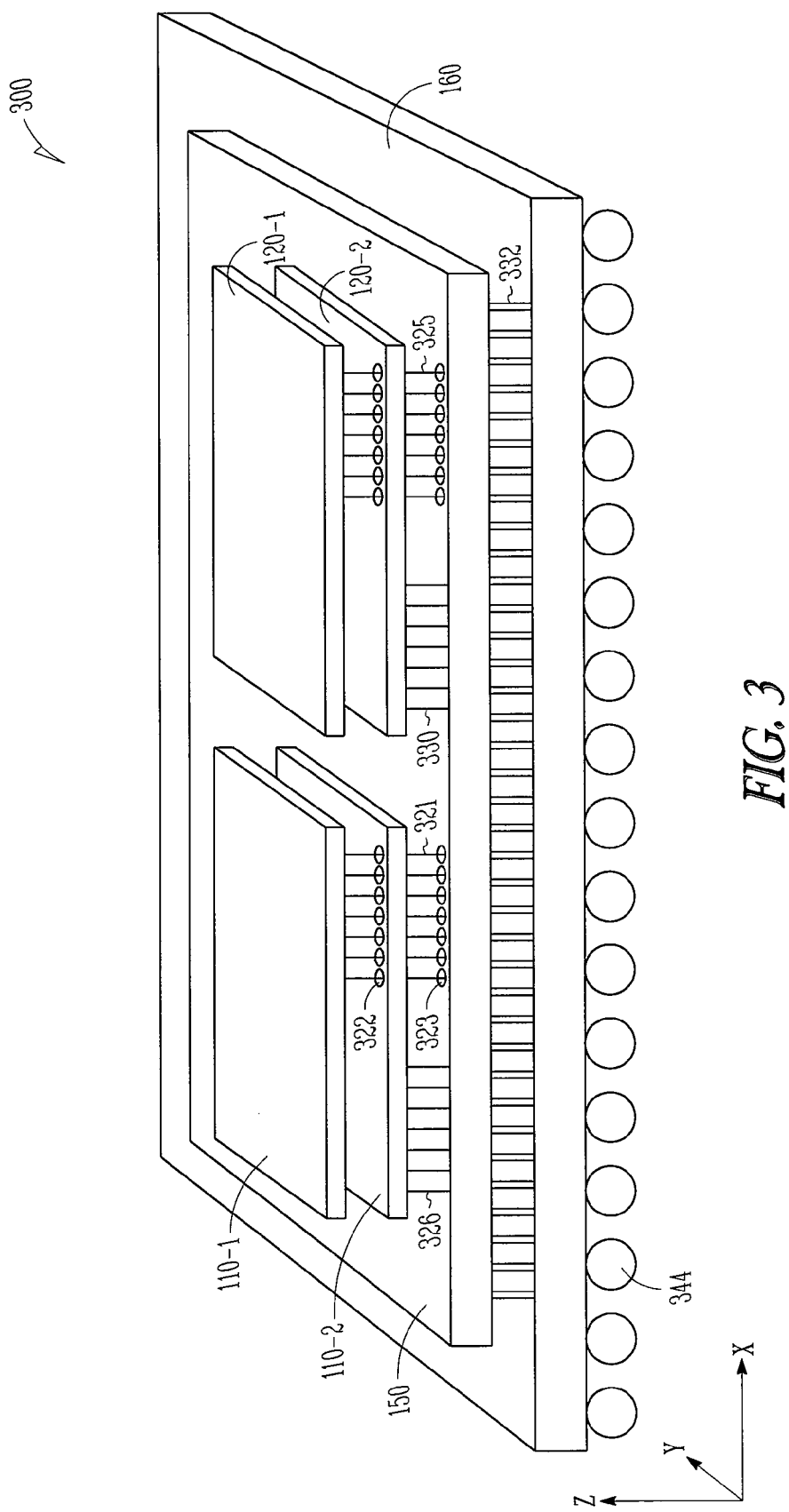
FIG. 3 illustrates a perspective view of the memory system shown in FIG. 1, according to some embodiments of the invention.

In some embodiments, the interface device 150 is coupled to 32 different memory devices (each having several memory arrays; other numbers of devices are possible) with independent interconnects such as the through wafer interconnect (TWI) shown in FIG. 3. In some embodiments, the interface device 150 is coupled to a set of TWI configured to provide different types of interconnection based on the end user application. In some embodiments, the set of TWI 321 passes through the memory Z-vias 322, 323 provided within memory arrays 110-1 and 110-2. In some embodiments, the TWI can be configured to provide connectivity between different types of DRAM and the interface device 150.

In some embodiments, the interface device 150 is configured to transmit and receive test pattern signals between the interface device 150 and the DRAM to calculate the optimum timing level for each interconnect. In some embodiments, the interface device 150 can have any number (e.g., 8, 16, 32, 64, 128, etc.) of I/O pads that provide for external system interconnection. In some embodiments, test pattern signals are transmitted and received between I/O terminals of the interface device 150 and the DRAM, and a training algorithm is executed to calculate an optimum timing for each input/output connection.

In some embodiments, the interface device 150 is configured to perform Error Check and Correction (ECC) during data communication between the memory devices 110, 120 and the processor module 160.

In some embodiments, DRAM controller 151 and Flash controller 152 within interface device 150 are configured to control memory devices 110, 120 by providing signals on 128-bit data busses. In some embodiments, the data busses provided within Z-vias 135 and 145 can have widths other than 128 bits. In some embodiments, the memory commands provided to the memory devices 110, 120 include commands to cause a programming operation to write data using the 128-bit data busses passing through Z-vias 135, 145 to the memory cells within memory devices 110, 120, a read operation to read data from the memory cells within memory devices 110, 120, and an erase operation to erase data from all or a portion of memory cells within memory devices 110, 120.

In some embodiments, memory devices 110, 120 include a flash memory device. In some embodiments, memory cells within memory arrays in memory devices 110, 120 can be arranged in a NAND flash memory arrangement. In some embodiments, memory cells within memory arrays in memory devices 110, 120 can include flash memory cells arranged in a NOR flash memory arrangement.

In some embodiments, memory devices 110, 120, interface device 150 and processor module 160 are included in the same electronic package. In some embodiments, the processor module 160 resides in a different package from that of memory devices 110, 120 and interface device 150.

In some embodiments, memory devices 110, 120 are stacked on one side of the interface device 150 and processor module 160 is positioned on the other side of the interface device 150 in a three-dimensional manner. In some embodiments, the memory arrays can interface with interface device 150 with a standard, variable width connection. This would allow different types/sizes of memory arrays to be connected to the interface device 150. In some embodiments, each side of the interface device can have a regular array of vias. In some embodiments, a group of vias can contain a memory channel that can be used to couple to the processor module 160. In some embodiments, the user can device as to how many memory channels are desired for a given processor module.

Figure 2:
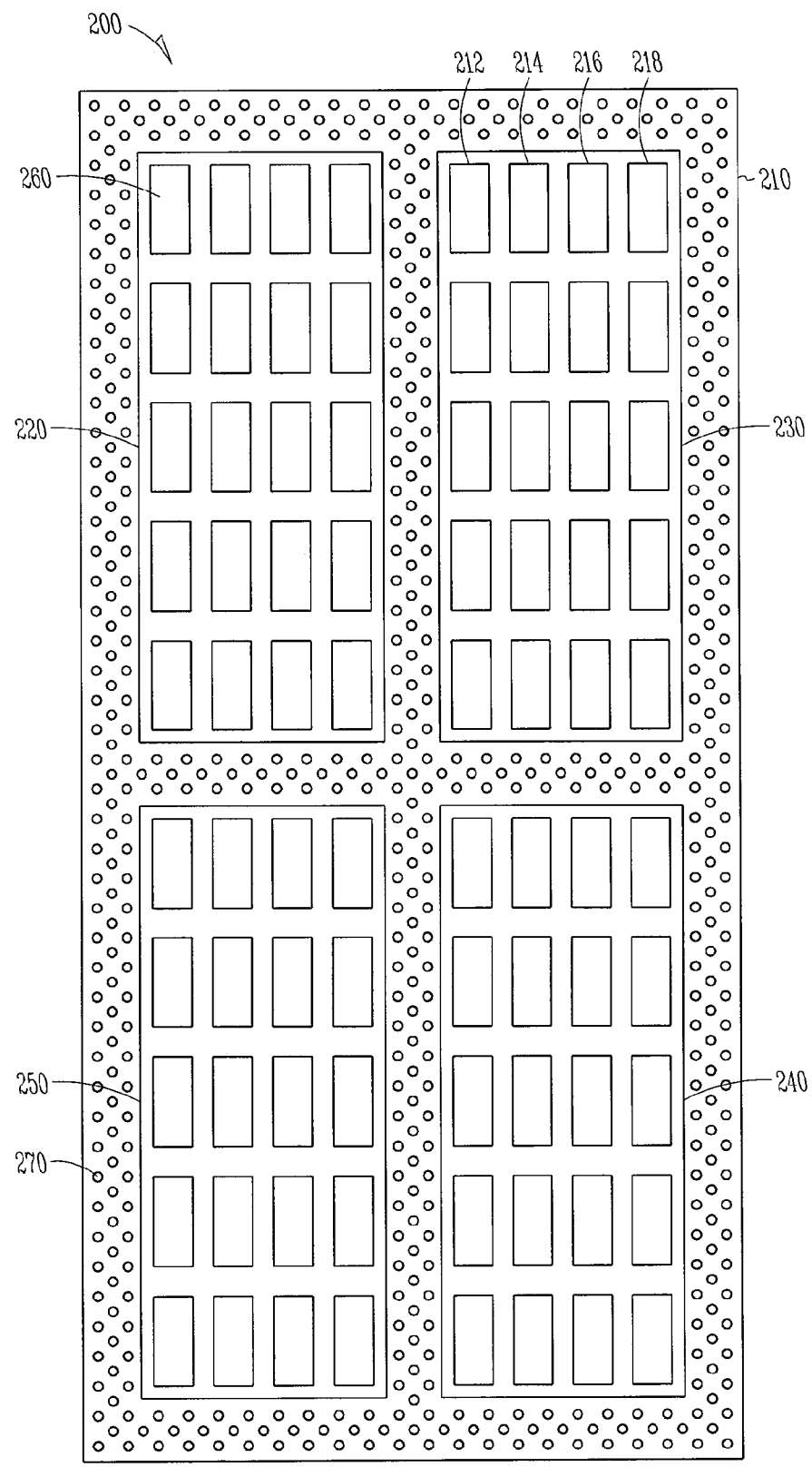
FIG. 2 illustrates a top view of a memory device, according to some embodiments of the invention.

FIG. 2 illustrates a top view of a memory system 200, in accordance with some embodiments of the invention. Memory system 200, which can be similar to or identical to the memory system 100 of FIG. 1, includes a substrate 210 having memory devices 220, 230, 240 and 250 disposed thereon. In some embodiments, each of memory devices 220, 230, 240 and 250 can include multiple memory arrays 260. In some embodiments, each of memory devices 220, 230, 240 and 250 includes a volatile memory device, a non-volatile memory device, or a combination of both. For example, memory devices 220, 230, 240 and 250 can include a DRAM device, a static random access memory (SRAM) device, a flash memory device, or a combination of these memory devices. In some embodiments, localized vias 270 are provided around memory devices 220, 230, 240 and 250 that provides a path for through wafer interconnects to couple other devices (such as interface device 150, processor module 160 shown in FIG. 1) that may be disposed above and below substrate 260.

FIG. 3 illustrates a perspective view of a memory system 300 similar to that shown in FIG. 1, according to some embodiments of the invention. Memory system 300 includes a substrate 310 having a matrix of solder balls 344, an interface device 150, a first memory array 110-1, a second memory array 110-2, a third memory array 120-1, and a fourth memory array 120-2. In some embodiments, the first memory array 110-1 is disposed on the second memory array 110-2 and the second memory array 110-2 is disposed on the interface device 150. In some embodiments, the third memory array 120-1 is disposed on the fourth memory array 120-2 and the fourth memory array 120-2 is disposed on the interface device 150. The first memory array 110-1 is coupled to Through Wafer Interconnects (TWI) 321, which in turn are coupled to the interface device 150. In some embodiments, TWI 321 passes through a set of vias 322 within second memory array 110-2 to connect with interface device 150. In some embodiments, TWI 321 passes through a set of vias 323 within interface device 150 to connect to devices within the substrate 310. In some embodiments, the second memory array 110-2 is coupled to interface device 150 using connection pins 326. In some embodiments, connection pin 330 communicatively couples memory array 120-2 with interface device 150 and TWI 325 communicatively couples memory array 120-1 with interface device 150. In some embodiments, connection pins 332 allow for communication between routing elements 152-158 embedded within interface device 150 and other devices (such as processors 162-168) embedded within substrate 160. In some embodiments, substrate 1600 can include a circuit board having circuits communicatively coupled to the interface device 150.

In some embodiments, memory system 300 can be included in computers (e.g., desktops, laptops, hand-held devices, servers, Web appliances, routing elements, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, compact disc players, DVD players, video cassette recorders, DVD recorders, camcorders, digital cameras, MP3 (Motion Picture Experts Group, Audio Layer 3) players, video games, watches, etc., and the like.

Figure 4:
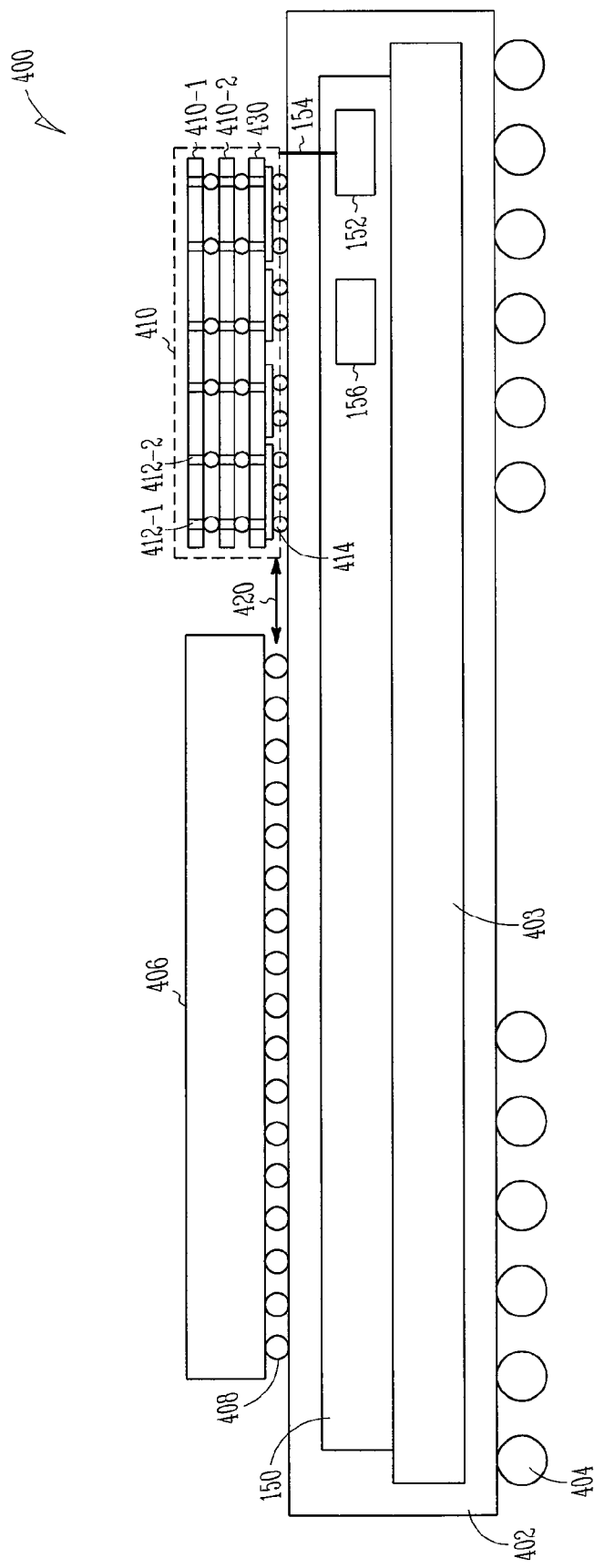
FIG. 4 illustrates a cross-sectional view of system similar to that shown in FIG. 1, according to some embodiments of the invention.

FIG. 4 illustrates a cross-sectional view of system 400 similar to that shown in FIG. 1, according to some embodiments of the invention. System 400 includes a package 402 having an interface device 150 within the package 402, a processor module 406 attached to the package 402 using a matrix of solder balls 408, and a memory device 410. In some embodiments, memory device 410 includes memory arrays 410-1, 410-2, a memory buffer 430 and TWI 412-1, 412-2 that connect memory arrays 410-1, 410-2 to memory buffer 430. In some embodiments, processor module 406 includes processors 162-168. In some embodiments, memory device 410 includes memory arrays similar to 110-1, 110-2, 110-3 and 110-4. In some embodiments, memory device 410 includes memory arrays similar to 120-1, 120-2, 120-3 and 120-4.

In some embodiments, the interface device 150 is disposed on the processor 406 and the memory device 410 is disposed on the interface device 150. In some embodiments, package 402 may include a circuit board 403 and interface device 150 is disposed on the circuit board 403 and the memory device 410 is disposed on the interface device 150. In some embodiments, memory device 410 is communicatively coupled to the processor 406 using a narrow high speed bus 420. In some embodiments the narrow high speed bus is configured to communicate data at 128 GB/s. In some embodiments, the narrow high speed bus 420 provides for full duplex communication having 64 GB/s for read data and 64 GB/s for write data.

In some embodiments, package 402 is attached to a matrix of solder balls 404 that enables system 400 to be mounted on a circuit board having other devices. In some embodiments, memory device 410 is attached to a matrix of solder balls 414 used to communicatively couple the memory device 410 to package 402.

In some embodiments, interface device 150 acts as an interconnection device and an I/O driver. In some embodiments, the interface device 150 includes traditional functional blocks present within DRAM dice, such as I/O pads, delayed-locked loop (DLL) circuitry, and First In, First Out (FIFO) circuitry that provides read and write pointers, storage, and control logic. Transferring these functional blocks, which are well-known to those of ordinary skill in the art, from the DRAM dice into the interface device 150 can allow for the increase in storage area of the DRAM dice.

In some embodiments, the interface device 150 is coupled to 32 different memory devices (each having several memory arrays; other numbers of devices are possible) with independent interconnects such as the TWI shown in FIG. 4. In some embodiments, the interface device 150 is coupled to a set of TWI that are configured to provide different types of interconnection based on the end user application. In some embodiments, the TWI can be configured to provide connectivity between independent groups of DRAM and the interface device 150.

In some embodiments, the interface device 150 is configured to transmit and receive test pattern signals between the interface device 150 and the DRAM to calculate the optimum timing level for each interconnect. In some embodiments, the interface device 150 can have any number (e.g., 8, 16, 32, 64, 128, etc.) of I/O pads that provide for external system interconnection. In some embodiments, test pattern signals are transmitted and received between I/O terminals of the interface device 150 and the DRAM, and a training algorithm is executed to calculate an optimum timing for each input/output connection.

In some embodiments, the interface device 150 is configured to perform power management within system 400, wherein the interface device 150 is operated at a voltage sufficient to prevent the generation of error bits in the communication between the interface device 150 and memory device 410.

In some embodiments, the interface device 150 is configured to perform error detection and/or correction during data communication between the memory device 410 and the processor module 406. In some embodiments, the interface device 150 is configured to perform power management of system 400 by operating at some voltage that is determined beforehand such that no error bits are generated at that voltage.

In some embodiments, the interface device 150 includes a diagnostic and Built in Self-Test (BIST) module 152. In some embodiments, the BIST module is coupled to a maintenance bus 154 that is coupled between the interface device 150 and memory device 410. In some embodiments, the BIST module is configured to send command signals and data to the memory device 410 through the maintenance bus 154 that are received from a user. In some embodiments, the maintenance bus 154 is also used to receive the results of the diagnostic testing. In some embodiments, the diagnostic and BIST module 152 generates control signals and forwards the user supplied command and data signals to carry out the commands of the user. For example, the diagnostic and BIST module 152 may invoke a pattern generator program or hardware module to begin generating a test pattern in accordance with the user's commands and data, and also forward the user provided memory commands to a sequencer 156 for translation into control signals that will be applied to the memory device 410 for carrying out diagnostic operations of memory device 410.

Figure 5A:
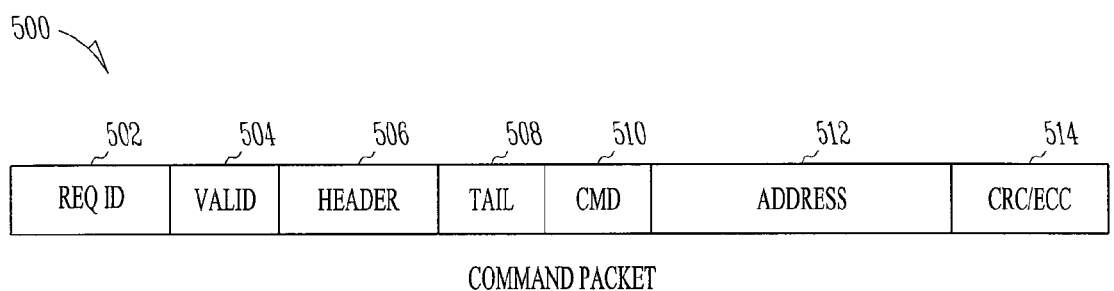
FIG. 5A illustrates a data structure of a command packet used in memory system shown in FIG. 1, according to various embodiments of the invention.

FIG. 5A illustrates a data structure 500 of a command packet used in memory system shown in FIG. 1, according to various embodiments of the invention. In some embodiments, the user can interface to memory systems 110 and 120 using "read" and "write" packets. In other words, the actual operation of the memory device (for e.g. a DRAM) is virtualized behind interface device 150. In some embodiments, memory commands and data are sent using separate read and write channels (uplinks and downlinks). In some embodiments, data structure 500 contains varies fields that includes request ID digits 502, valid indicator digits 504, header digits 506, tail digits 508, command digits 510, address digits 512 and CRC (cyclic redundancy code)/ECC (error correction code) digits 514. In some embodiments, request ID digits 502 are used to identify the address of the sender sending the command digits 510. In some embodiments, the request ID digits are used to re-order the data that is returned to the sender. In some embodiments, valid indicator digits 504 are used to indicate the validity of the data being transferred. In some embodiments, header digits 506 are used to identify the start of a data block transfer and the tail digits 508 are used to identify the end of a data block transfer. In some embodiments, the command bits are used to read, write or configure a memory device 110, 120. In some embodiments, the address digits 512 contain X, Y address for routing data to memory locations within the memory device 110, 120, wherein, the X would indicate the sending entities address and Y would indicate the receiving entities address. In some embodiments, CRC/ECC digits are used to provide error detection and correction.

Figure 5B:
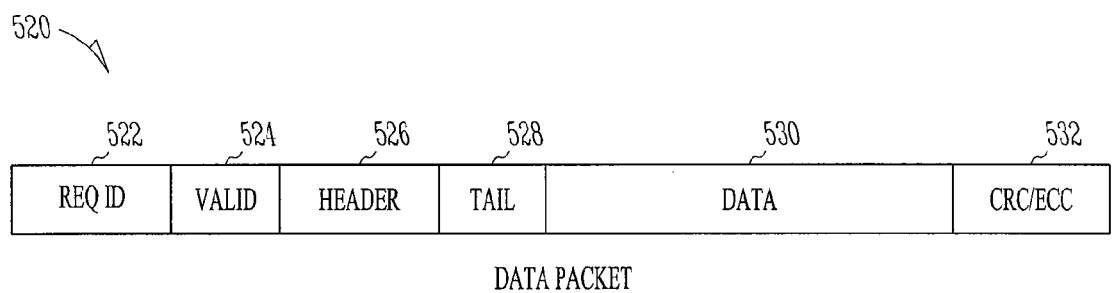
FIG. 5B illustrates a data structure of a data packet used in memory system shown in FIG. 1, according to various embodiments of the invention.

FIG. 5B illustrates a data structure 520 of a data packet used in memory system shown in FIG. 1, according to various embodiments of the invention. In some embodiments, data structure 520 contains varies fields that includes request ID digits 522, valid indicator digits 524, header digits 526, tail digits 528, data digits 530 and CRC (cyclic redundancy code)/ECC (error correction code) digits 532. In some embodiments, request ID digits 522 are used to identify the address of the sender sending the data digits 530. In some embodiments, valid indicator digits 504 are used to indicate the validity of the data digits 530 being transferred. In some embodiments, header digits 526 are used to identify the start of a data block transfer and the tail digits 528 are used to identify the end of a data block transfer. In some embodiments, the data width represented by data digits field 530 can be programmable to any of 32, 64, 128 digits. In some embodiments, CRC/ECC digits are used to provide error detection and correction.

In some embodiments, the router elements can be programmed based on memory ranges of the memory devices to which they are communicatively coupled. In some embodiments, the first packet establishes a connection between the memory system and interface device until the "end/tail" packet arrives.

Figure 6:
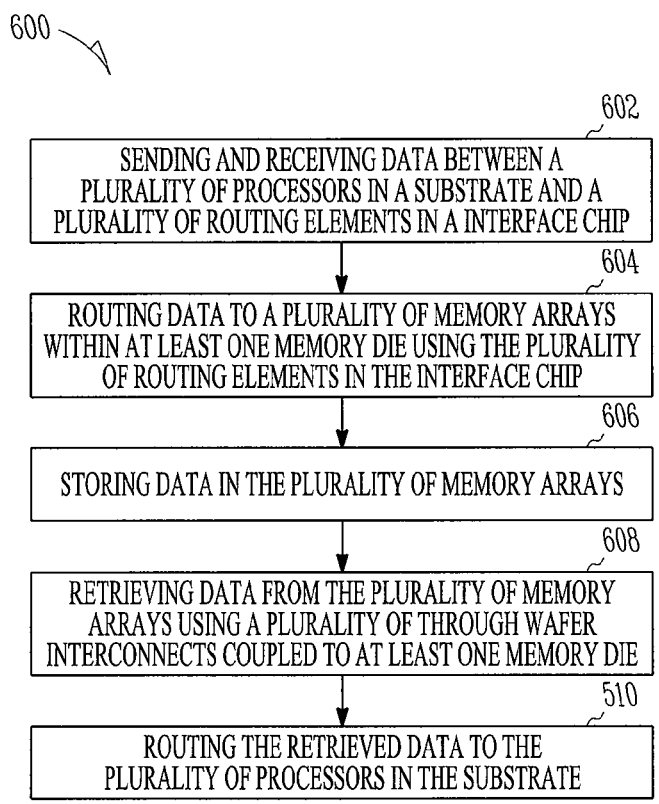
FIG. 6 illustrates a flow diagram of a method of operation of system shown in FIG. 3, according to some embodiments of the invention.

FIG. 6 illustrates a flow chart of a method 600 of operation of system shown in FIG. 1 and FIG. 4, according to some embodiments of the invention. At 602, method 600 includes sending and receiving data between a plurality of processors in a processor module 160 and a plurality of routing elements in an interface device 150. At 604, method 600 includes routing data to a plurality of memory arrays within at least one memory device using the plurality of routing elements in the interface device 150. At 606, method 600 includes storing data in the plurality of memory arrays. In some embodiments, at 606, the method includes storing the data in a DRAM array. In some embodiments, at 606, the method includes storing the data in a NAND flash array. In some embodiments, at 606, the method includes storing the data in a NOR flash array. At 608, method 600 includes retrieving data from the plurality of memory arrays using a plurality of through wafer interconnects provided in vias of an interface device and/or at least one memory device, the interface device being above or below and being coupled to at least one memory device. At 610, method 600 includes routing the retrieved data to the plurality of processors in the processor module using the plurality of routing elements and interconnects. In some embodiments, the plurality of processors communicates with the memory devices 110, 120 over a high speed chip-to-chip interconnect 420. In some embodiments, memory devices 110, 120 can also be coupled to each other using a similar high speed chip-to-chip interconnect. In some embodiments the high speed chip-to-chip interconnect is configured to communicate data at 128 GB/s. In some embodiments, the high speed chip-to-chip interconnect 420 provides for full duplex communication having 64 GB/s for read data and 64 GB/s for write data.

In some embodiments, the interface device 150 is configured to communicatively couple the plurality of memory arrays within memory devices 110, 120 to the plurality of processors 162-168 using the plurality of routing elements 151-159 based on commands stored within packet data exchanged between them.

Figure 7:
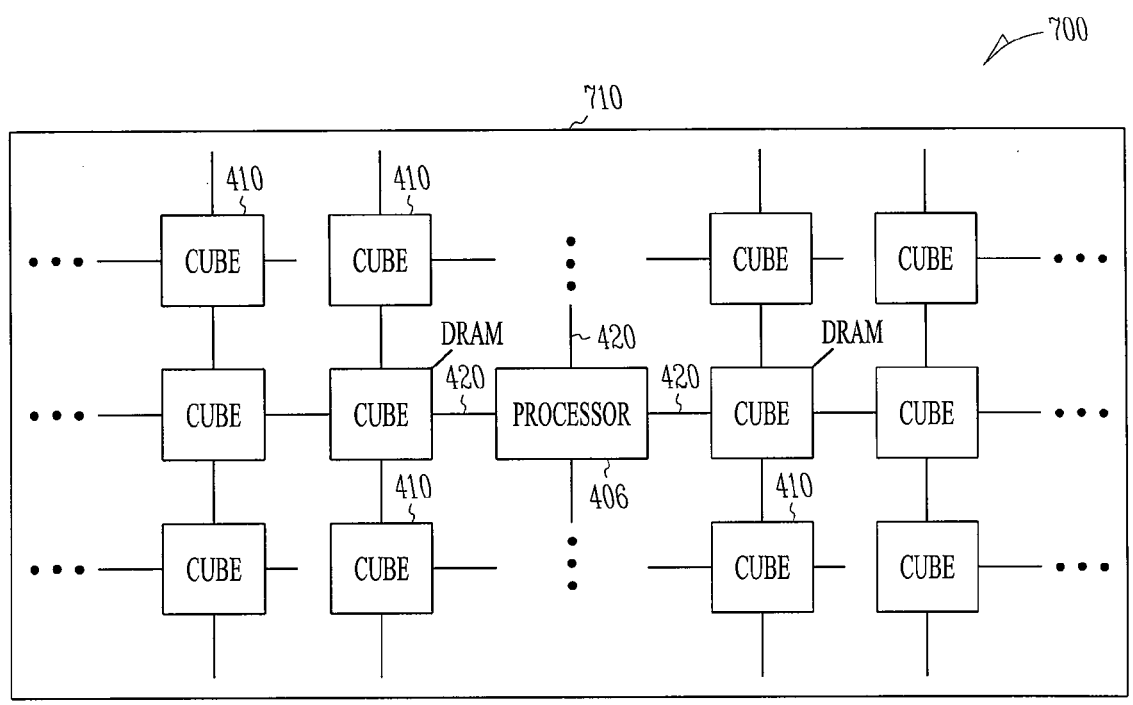
FIG. 7 illustrates a schematic diagram showing a memory system coupled to a processor module, according to some embodiments of the invention.

FIG. 7 illustrates a schematic diagram 700 showing a memory system coupled to a processor module, according to some embodiments of the invention. FIG. 7 includes a system 710 including a plurality of processor modules 406 and a plurality of memory device 410, similar to that shown in FIG. 7. In some embodiments, the memory devices 410 adjacent to the processor modules 406 are coupled to the processor modules 406 closest to it using a narrow high speed bus 420. In some embodiments, the memory devices 410 shown in FIG. 7 can be cubical in structure and coupled to the four adjacent cubical memory devices using a narrow high speed bus 420. In some embodiments, the narrow high speed bus 420 is configured to communicate data at 128 GB/s. In some embodiments, the narrow high speed bus 420 provides for full duplex communication having 64 GB/s for read data and 64 GB/s for write data.

The apparatus, systems, and methods disclosed herein can provide for increased speed and throughput while accessing memory arrays in addition to achieving a higher density of memory arrays compared to conventional designs. In some embodiments, as a result, the DRAM die size is also reduced. Additionally, use of through wafer interconnects allows for a larger number of interconnects traversing shorter distances and consequently improving the speed of each connection established by the interconnects. Moreover, the apparatus, systems and methods disclosed herein provides for processors coupled to memory arrays that are capable of handling more bandwidth with reduced latency in designs having improved packing density.

The accompanying drawings that form a part hereof show, by way of illustration and not of limitation, specific embodiments in which the subject matter can be practiced. The embodiments illustrated are described in sufficient detail to enable those skilled in the art to practice the teachings disclosed herein. Other embodiments can be used and derived therefrom, such that structural and logical substitutions and changes can be made without departing from the scope of this disclosure. This Detailed Description, therefore, is not to be taken in a limiting sense, and the scope of various embodiments is defined only by the appended claims and the full range of equivalents to which such claims are entitled.

Although specific embodiments have been illustrated and described herein, any arrangement calculated to achieve the same purpose can be substituted for the specific embodiments shown. This disclosure is intended to cover any and all adaptations or variations of various embodiments. Combinations of the above embodiments and other embodiments not specifically described herein will be apparent to those of skill in the art upon studying the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter can be found in less than all features of a single disclosed embodiment. Thus the following claims are hereby incorporated into the Detailed Description, with each claim standing on its own as a separate embodiment.

Methods, apparatus, and systems have disclosed memory device connection schemes that can increase memory capacity within a given horizontal space. Various embodiments include a substrate, an interface device disposed on the substrate, a first memory die having a plurality of memory arrays disposed on the interface device, with the first memory die coupled to a plurality of through wafer interconnects (TWI). Various embodiments include a second memory die having a plurality of memory arrays disposed on the first memory die, the second memory die including a plurality of vias, wherein the plurality of vias are configured to allow the plurality of TWI to pass through the second memory die. The second memory die, in turn, can be coupled to a second plurality of TWI, and the interface device can be used to communicatively couple the first memory die and the second memory die using the first and second plurality of TWI. Additionally, the interface device includes a plurality of routing elements that communicatively couples the first memory die and second memory die with a plurality of processors using the plurality of through wafer interconnects.

One or more embodiments provide an improved mechanism for interconnecting memory devices. Furthermore, various embodiments described herein can improve the density of some memory arrays within memory devices and, as a result, reduce the size of memory devices.

What is claimed is:

1. An apparatus comprising:
   an interface chip disposed on a processor integrated circuit (IC), the interface chip including a plurality of routing elements;
   at least one memory die disposed on the interface chip and including a first plurality of memory arrays, the first plurality of memory arrays coupled to the interface device using a first plurality of interconnects provided in vias in at least one of the interface chip or the at least one memory die,
   wherein each via includes an opening, the opening configured to allow an interconnect of the first plurality of interconnects to partially or completely pass through at least one of the interface chip or the at least one memory die; and
   wherein the interface chip is configured to communicatively couple the first plurality of memory arrays to the processor IC using the plurality of routing elements and the interconnects.

2. The apparatus of claim 1, wherein the interface chip is configured to provide memory commands to the at least one memory die.

3. The apparatus of claim 1, further comprising a second memory die including a second plurality of memory arrays.

4. The apparatus of claim 3, wherein the interface chip is configured to perform Error Check and Correction (ECC) during data communication between the at least one memory die and the processor IC.

5. The apparatus of claim 3, wherein the second plurality of memory arrays comprises a NAND flash memory array.

6. The apparatus of claim 3, wherein the second plurality of memory arrays comprises a NOR flash memory array.

7. The apparatus of claim 3, wherein the interconnects comprise through wafer interconnects that form a data bus coupling the plurality of first and second plurality of memory arrays and the interface device.

8. The apparatus of claim 3, wherein the at least one memory die further comprises a second plurality of interconnects provided in vias to couple the second plurality of memory arrays to the plurality of routing elements in the interface device.

9. The apparatus of claim 8, wherein the interface device includes circuitry configured to perform sequencing of at least one DRAM array.

10. The apparatus of claim 9, wherein the first and second plurality of interconnects extend in a vertical direction that is substantially perpendicular to a plane including the at least one memory die.

11. The apparatus of claim 1, wherein the interface chip is configured to perform power management of the apparatus, and wherein the interface chip is configured to operate at a voltage sufficient to preclude error bit generation.

12. The apparatus of claim 1, wherein the interface chip further comprises an input/output driver circuit.

13. The apparatus of claim 1, wherein the interface chip is configured to implement a refresh scheme to control error rates based on a type of array used in the at least one memory die.

14. The apparatus of claim 1, wherein the interface chip is configured to implement a refresh scheme to control error rates based on signal characteristics of the at least one memory die.

15. A system comprising:
   a processor module including a plurality of processors;
   an interface chip disposed on the processing module, the interface chip including a plurality of routing elements and a first plurality of vias adapted to pass a plurality of interconnects, wherein a via of the first plurality of vias includes an opening configured to allow a first interconnect of the plurality of interconnects to partially or completely pass through the interface chip;
   a first memory device disposed above or below the interface chip, the first memory device including a plurality of DRAM memory arrays and a second plurality of vias adapted to pass at least one of the plurality of interconnects to couple the plurality of DRAM memory arrays to the interface chip, wherein a via of the second plurality of vias includes an opening configured to allow a second interconnect of the plurality of interconnects to partially or completely pass through the first memory device;
   a second memory device disposed above or below the interface device, the second memory device including a plurality of FLASH memory arrays and a third plurality of vias adapted to pass at least one of the plurality of interconnects to couple the plurality of FLASH memory arrays to the interface chip, wherein a via of the third plurality of vias includes an opening configured to allow a third interconnect of the plurality of interconnects to partially or completely pass through the second memory device; and
   wherein the plurality of routing elements in the interface chip is configured to communicatively couple the plurality of DRAM memory arrays and the plurality of FLASH memory arrays to the plurality of processors.

16. The system of claim 15, wherein the interface chip is disposed above a circuit board within a package.

17. The system of claim 15, wherein the first and second memory device are coupled to the processor module using a portion of the plurality of interconnects.

18. The system of claim 15, wherein the plurality of routing elements are coupled to the plurality of processors using the plurality of interconnects.

19. The system of claim 15, wherein the plurality of routing elements are coupled to the plurality of processors using connection pins.

20. The system of claim 15, wherein the processor module comprises a substrate with embedded processors.

21. The system of claim 15, wherein the processor module comprises an ASIC.

22. The system of claim 15, wherein the processor module includes a single-core processor.

23. The system of claim 15, wherein the processor module includes a multi-core processor.

24. A method comprising:
   receiving data to provide received data from a processor integrated circuit (IC) at an interface chip disposed above or below the processor IC module;
   routing the received data to a plurality of memory arrays within at least one memory die disposed above or below the interface chip using a plurality of routing elements in the interface chip and a plurality of interconnects extending through openings in the interface chip and/or the at least one memory die;

retrieving data to provide retrieved data from the plurality of memory arrays using the interconnects, the interface chip being disposed above or below and being coupled to the at least one memory die; and routing the retrieved data to the processor module using the plurality of routing elements and the plurality of interconnects.

25. An apparatus comprising:

an interface device coupled to a processor module including a plurality of processors, the interface device including a plurality of routing elements and the interface device configured to send and receive packet data to and from at least one of the plurality of processors;

at least one memory device including a plurality of memory arrays coupled to the interface device using a plurality of interconnects extending through openings in at least one of the interface device or the memory device, the memory device configured to send and receive data to and from the interface device; and wherein the interface device is configured to communicatively couple the plurality of memory arrays to the plurality of processors using the plurality of routing elements based on commands stored in the packet data.

26. A method comprising:

receiving packet data to provide received packet data from a processor module at an interface device in an electronic package;

routing the received packet data based on an address provided within the packet data using a plurality of routing elements in the interface device and a plurality of interconnects extending through openings in the interface device;

retrieving stored data to provide retrieved stored data from a plurality of memory arrays of at least one memory device based on memory commands provided within the packet data; and routing the retrieved stored data to the processor module using the plurality of routing elements.

* * * * *